(12) United States Patent
Gutsche et al.

(10) Patent No.: US 7,998,858 B2
(45) Date of Patent: Aug. 16, 2011

(54) VERTICAL INTERCONNECT STRUCTURE, MEMORY DEVICE AND ASSOCIATED PRODUCTION METHOD

(75) Inventors: Martin Gutsche, Dorfen (DE); Franz Kreupl, Munich (DE); Harald Seidl, Poering (DE)

(73) Assignee: Infineon Technologies AG, Neubiberg (DE)

( * ) Notice: Subject to any disclaimer, the term of this patent is extended or adjusted under 35 U.S.C. 154(b) by 433 days.

(21) Appl. No.: 11/588,769

(22) Filed: Oct. 27, 2006

(65) Prior Publication Data

US 2007/0105333 A1    May 10, 2007

(30) Foreign Application Priority Data

Oct. 31, 2005  (DE) .................. 10 2005 051 973

(51) Int. Cl.
*H01L 21/4763* (2006.01)
(52) U.S. Cl. ............... 438/630; 257/768; 257/E21.593
(58) Field of Classification Search .............. 438/622, 438/584, 597, 618, 682–683, 651, 630, 649; 257/E21.602, E21.532, E21.598, E21.599, 257/E21.589, E51.591, E51.593, 746, 768–770; 326/37, 38, 39, 40, 41
See application file for complete search history.

(56) References Cited

U.S. PATENT DOCUMENTS

| | | | | |
|---|---|---|---|---|
| 7,084,507 | B2 * | 8/2006 | Awano | 257/773 |
| 7,217,650 | B1 * | 5/2007 | Ng et al. | 438/622 |
| 7,256,498 | B2 * | 8/2007 | Huang et al. | 257/758 |
| 2003/0189202 | A1 | 10/2003 | Li et al. | |
| 2005/0026411 | A1 | 2/2005 | Tanamoto et al. | |
| 2006/0273389 | A1 * | 12/2006 | Cohen et al. | 257/331 |

FOREIGN PATENT DOCUMENTS

| | | |
|---|---|---|
| DE | 101 33 373 A1 | 1/2003 |
| EP | 1 473 767 A2 | 11/2004 |

OTHER PUBLICATIONS

Wu et al.; Single-crystal metallic nanowires and metal/semiconductor nanowire heterostructures; Jul. 2004; Nature; vol. 430; pp. 61-64.*
Peng et al (Dendrite-Assited Growth of Silicon nanowires in electroless metal deposition, Adv.Func.Mater.2003,13No. 2,Feburary).*
Direct Diameter-Controlled Growth of Multiwall Carbon Nanotubes on Nickel-Silicide Layer, M. Nihei, A. Kawabata, Y. Awano, Jpn. J. Appl. Phys. vol. 42 (2003) pt. 2, No. 6B, pp. L721-L723.
Kohlenstoff-Nanoröhrchen für die Mikroelektronik?, W. Hönlein, F. Kreupl, Physik Journal 3 (2004), Nr. 10, pp. 39-44.

* cited by examiner

*Primary Examiner* — Matthew W Such
*Assistant Examiner* — Ali Naraghi

(57) ABSTRACT

The present invention relates to a method for producing a vertical interconnect structure, a memory device and an associated production method, in which case, after the formation of a contact region in a carrier substrate a catalyst is produced on the contact region and a free-standing electrically conductive nanoelement is subsequently formed between the catalyst and the contact region and embedded in a dielectric layer.

7 Claims, 13 Drawing Sheets

B - B

US 7,998,858 B2

VERTICAL INTERCONNECT STRUCTURE, MEMORY DEVICE AND ASSOCIATED PRODUCTION METHOD

CROSS-REFERENCE TO RELATED APPLICATIONS

This application claims priority to German Patent Application DE 10 2005 051 973.3, filed Oct. 31, 2005, which is herein incorporated in its entirety by reference.

BACKGROUND

1. Field of the Invention

The present invention relates to a vertical interconnect structure, a memory device and an associated production method.

2. Description of Related Art

For the formation of integrated semiconductor circuits, a multiplicity of interconnect structures are required for realizing a wiring or for connecting the semiconductor components formed in the semiconductor substrate. On the one hand, these are horizontal interconnect structures that are formed essentially in metallization planes lying above a semiconductor substrate and are isolated from one another by dielectric layers lying in between. Furthermore, vertical interconnect structures are required, which either enable a contact-connection from a first interconnect or metallization plane to the underlying semiconductor substrate and are usually referred to as contacts or, in superordinate metallization planes or interconnect planes, provide for a connection between said interconnect planes and are usually referred to as contact vias.

Particularly in semiconductor memory devices having volatile or nonvolatile memory elements, a high integration density is necessary in order to realize a maximum number of items of information per unit area. Furthermore, the production costs are of particular importance for commercialization.

Usually, in order to realize such vertical interconnect structures or contacts or contact vias, by means of photolithographic methods, contact holes or openings are formed in the dielectric layers and the contact holes are subsequently filled with electrically conductive filling material. The very high production costs and also the minimum feature sizes which can be realized only to a limited extent, which prevent more extensive integration, are disadvantageous in this case in particular on account of the photolithographic method. Accordingly, there is a need for an improved vertical interconnect structure, memory device and associated methods of production.

SUMMARY

The invention is based on the object of providing a production method for vertical interconnect structures, a memory device and an associated production method, an integration density being increased further and the production costs being reduced further.

In particular, by forming a catalyst on a contact region in a carrier substrate, subsequently forming a free-standing electrically conductive nanoelement between the catalyst and the contact region, and finally embedding the free-standing nanoelement in a dielectric layer, it is possible for the first time to produce vertical interconnect structures with minimal dimensions in self-aligning fashion and thus in a very simple manner.

In order to improve an electrical contact-connection, a metal-semiconductor compound, and particularly when using silicon as semiconductor material so-called suicides, may be formed at the surface of the contact region.

Furthermore, for the purpose of more extensively decreasing or reducing the feature size of the vertical interconnect structure, the catalyst may be coagulated by means of e.g. thermal processing. This results in a self-aligning structure miniaturization process that significantly reduces a cross-sectional area of the vertical interconnect structure.

So-called nanowires, nanotubes or nanofibers are preferably produced as nanoelements or nanostructures. When using silicon nanoelements, a complete siliciding is preferably carried out, whereby the electrical properties of the interconnect structure can be improved further and, in particular, an interconnect resistance is significantly reduced.

As the dielectric layer, $SiO_2$ is preferably deposited over the whole area by means of e.g. a CVD method and subsequently planarized as far as the surface of the nanoelement. This results in an insulation having outstanding electrical properties, in which case a layer thickness of the dielectric layer can be set particularly simply.

The memory device has at least one memory element and also at least one selection transistor for selecting the at least one memory element via a word line, a bit line furthermore being connected for reading/writing the information. In this case, an electrically conductive and initially free-standing nanoelement connects the memory element to the selection transistor. Memory devices having particularly high integration densities can be formed in this way, with at least one photolithographic mask being saved.

In order to realize so-called elevated source/drain regions, semiconductor layers deposited epitaxially may additionally be formed on the source/drain regions present in the semiconductor substrate, whereby the electrical properties of the selection transistors to be realized can be improved.

Preferably, as the memory element, a phase change memory element is formed at the surface of the dielectric layer and connected via the nanoelement. On account of the very small cross-sectional areas of the nanoelement, the sufficiently high electric current densities required for programming of a phase change material used in phase change memory elements can be realized without any problems.

As an alternative, it is also possible to form capacitors and other resistively switchable memory cells as memory elements at the surface of the dielectric layer embedding the nanoelements.

The memory device preferably has two selection transistors for driving two memory elements, a common diffusion region of the selection transistors electrically connecting the latter to one another. An information density per unit area can be increased further in this way.

With regard to the method for producing a memory device, preferably at least one active region is formed in a semiconductor substrate and strip-type word line stacks with a gate dielectric layer and a gate layer are subsequently formed on the semiconductor substrate or at the surface of the active region in order to define at least two contact regions in the active region. The formation of source/drain regions in said contact regions is followed in turn by formation of at least one free-standing electrically conductive nanoelement on at least one of the contact regions, the at least one free-standing nanoelement subsequently being embedded in a dielectric layer. A bit line layer is furthermore formed at least in the dielectric layer, which is electrically connected to the further contact region. Finally, at least one memory element which is electrically connected to the at least one nanoelement is formed at the surface of the dielectric layer. A memory device having extremely high integration density is obtained with minimal costs in this way.

Preferably, a multiplicity of insular active regions are formed in the semiconductor substrate and they are divided into three contact regions by in each case two word line stacks. As a result, two one-transistor memory devices are produced in a cost-effective manner, a contact region that lies between the two word line stacks constituting a common drain region of the selection transistors and respective source regions being realized in the remaining contact regions.

Preferably, a common nanoelement is formed on the common drain region, a first depression subsequently being realized in the dielectric layer in the region of the common nanoelement, a bit line layer being filled into said first depression and the bit line layer subsequently being etched back in order to form a second depression, in order finally to completely fill the second depression with a dielectric filling material. In this way, it is possible to realize a bit line which is completely embedded in the dielectric layer and significantly simplifies subsequent processing and in particular production of the memory elements.

As an alternative, however, it is also possible for no nanoelement to be formed on the common drain region, in which case, after the embedding of the free-standing nanoelements, etching back of the dielectric layer is carried out in order to uncover an upper region of the nanoelements, formation of a dielectric etching stop layer at the surface of the dielectric layer and of the uncovered regions of the nanoelements is carried out, and an auxiliary dielectric layer is formed at the surface of the etching stop layer. Afterward, in the region of the common drain region, a trench is formed in the dielectric layer, the etching stop layer and the auxiliary dielectric layer as far as the drain region, said trench is filled with the bit line layer, the bit line layer is etched back in order to form a depression and said depression is completely filled with dielectric filling material. This again results in a bit line which is completely embedded in the dielectric layer and significantly simplifies subsequent formation of the memory elements.

Further objects, features and advantages of this invention will become readily apparent to persons skilled in the art after a review of the following description, with reference to the drawings and claims that are appended to and form a part of this specification.

DETAILED DESCRIPTION

Figure 1A:
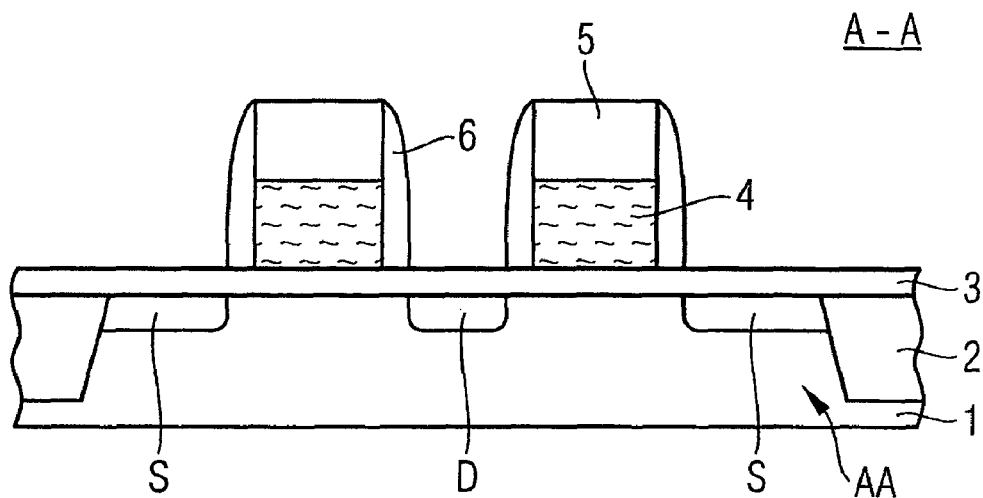
FIGS. 1A to 11 illustrate simplified sectional views and also plan views of essential method steps in the production of a memory device with an interconnect structure according to the invention in accordance with a first exemplary embodiment.
Figure 1B:
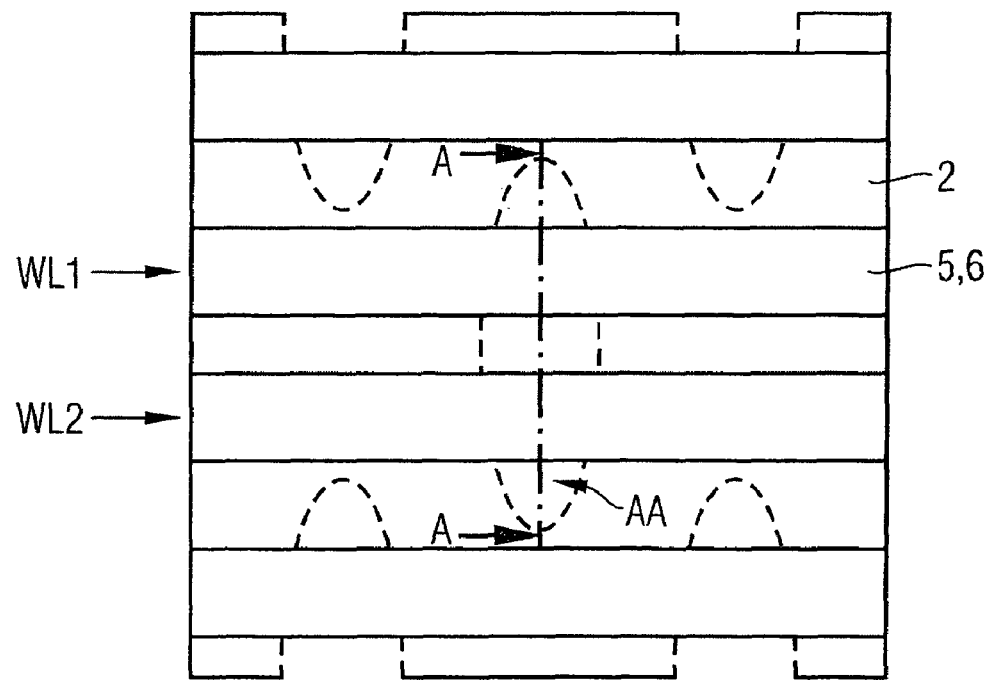

FIGS. 1A and 1B, respectively, show a simplified sectional view and also an associated plan view for illustrating preparatory method steps in the production of a vertical interconnect structure and a corresponding memory device. First, active regions AA are produced in a carrier substrate 1, which constitutes for example a semiconductor substrate and in particular a monocrystalline silicon semiconductor substrate, by the formation of e.g. a shallow trench isolation 2. The active regions AA are preferably defined in insular fashion, that is to say in the form of oval or rectangular closed-off regions, by means of an STI method (Shallow Trench Isolation).

Afterward, in accordance with FIG. 1A, a gate dielectric layer 3 may preferably be formed over the whole area at the surface of the carrier substrate 1 or of the active regions AA and the shallow trench isolation 2. Preferably, a gate oxide having a high quality and a very small thickness is formed thermally as the gate dielectric layer 3 by means of a thermal oxidation method. Afterward, an electrically conductive gate layer 4 is preferably deposited over the whole area, preferably doped polycrystalline semiconductor material and in particular polysilicon being deposited. Furthermore, a hard mask layer 5 is in turn preferably formed over the whole area at the surface of the gate layer 4, for example silicon nitride or silicon dioxide being used.

Afterward, the gate layer 4 and the hard mask layer 5 are patterned using a resist (not illustrated) by means of photolithographic methods and the word line stacks illustrated in FIG. 1A are formed. In this case, the gate dielectric layer 3 preferably still remains over the whole area. After the removal of the resist (not illustrated), so-called spacers 6 are subsequently formed, e.g. an SiN or $SiO_2$ layer being deposited over the whole area and etched back anisotropically until only the spacers 6 remain on the sidewalls of the word line stacks.

Using these word line stacks or the additionally present spacers 6 and hard mask layer 5, the corresponding source/drain, connection or LDD implantations can subsequently be carried out for the purpose of realizing the doping regions necessary for a field effect transistor. On account of the insular formation of the active regions AA and the use of precisely two strip-type word line stacks which overlie the active regions AA in such a way that precisely three contact regions are defined in the active region AA, a memory device having two memory cells is obtained in which each memory cell respectively has a field effect transistor and the two memory cells have a common drain contact. A very high integration density is obtained if only for this reason.

FIG. 1B shows a simplified plan view of the illustration in accordance with FIG. 1A, but the illustration of the gate dielectric layer 3 has been omitted here in order to better illustrate the insular structure of the active regions AA in conjunction with the overlying word line stacks or word lines WL1, WL2.

Figure 2:
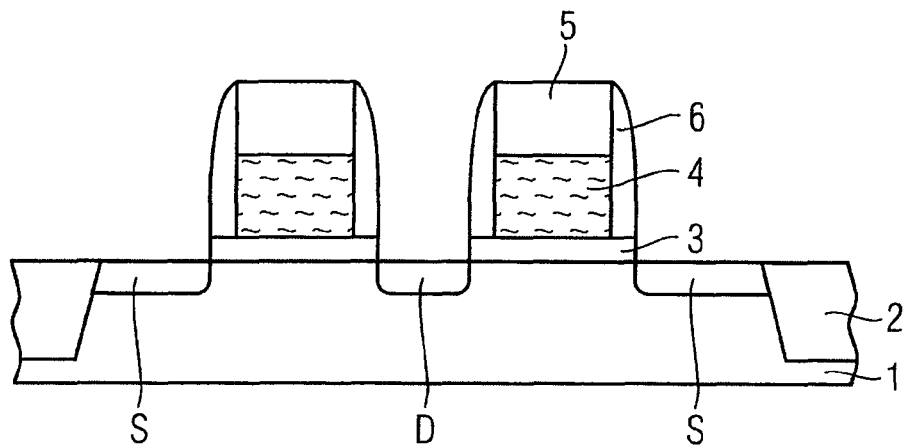

In accordance with FIG. 2, the gate dielectric layer 3 is now removed at least from the surface of the active regions AA or of the semiconductor substrate 1. For this purpose, dilute hydrofluoric acid (HF) is preferably used for the removal of the $SiO_2$ gate dielectric layer 3.

In an optional method step in accordance with FIG. 3, a so-called elevated source/drain region may subsequently be formed in order to improve the electrical properties of the field effect transistor to be formed, an elevated semiconductor layer 7A being formed at least at a surface of the source/drain regions S and D by means of selective epitaxial deposition methods. A selective Si epitaxy is preferably carried out in this case.

Figure 3:
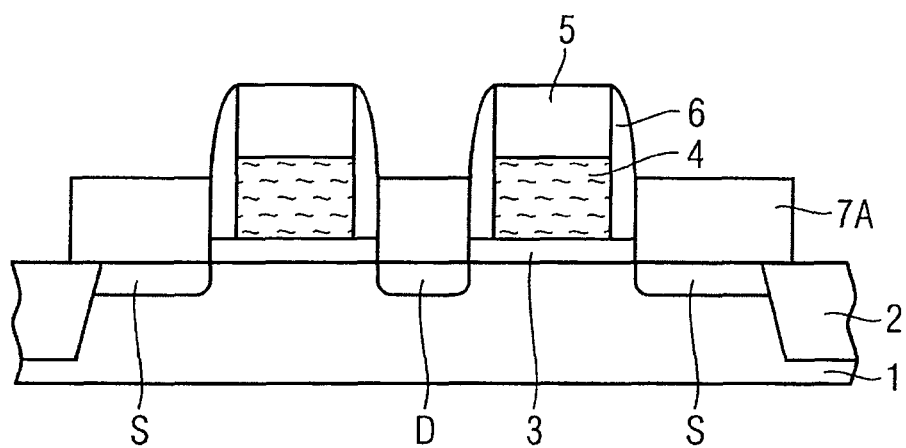
Figure 4:
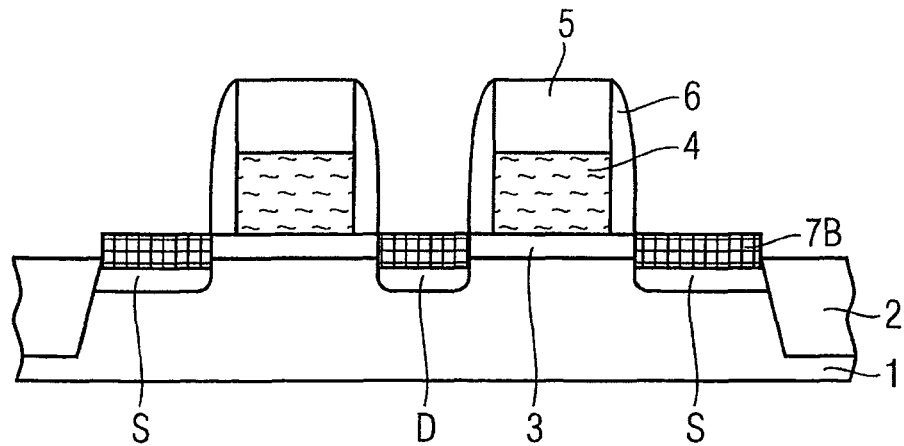

Preferably in accordance with FIG. 4, in addition to the method step in accordance with FIG. 3 or as an alternative thereto, a metal-semiconductor compound 7B may be formed as the surface of the contact regions, in particular self-aligning siliciding processes being employed when silicon is used as semiconductor material (salicide, self-aligned silicide). Examples of metal-semiconductor compounds 7B of this type are CoSi, NiSi, TiSi, etc.

In order to form a selective $CoSi_x$ metal-semiconductor compounds 7B, firstly a Co/TiN layer stack may be deposited for example by means of conventional sputtering methods (PVD, Physical Vapor Deposition). This is followed by a first thermal annealing at approximately 500 to 600 degrees Celsius with subsequent wet etching of the residual Co and TiN layers by means of e.g. $H_2O_2$. Finally, a second thermal annealing of the CoSi metal-semiconductor compound 7B at approximately 600 to 700 degrees Celsius is effected, whereby the metal-semiconductor compound 7B illustrated in FIG. 4 is obtained exclusively at the uncovered surfaces of the semiconductor substrate 1 or the contact regions for the memory device.

In this case, blocking masks may be formed in the periphery of a semiconductor component or of an integrated semiconductor circuit in order to prevent such siliciding.

Figure 5A:
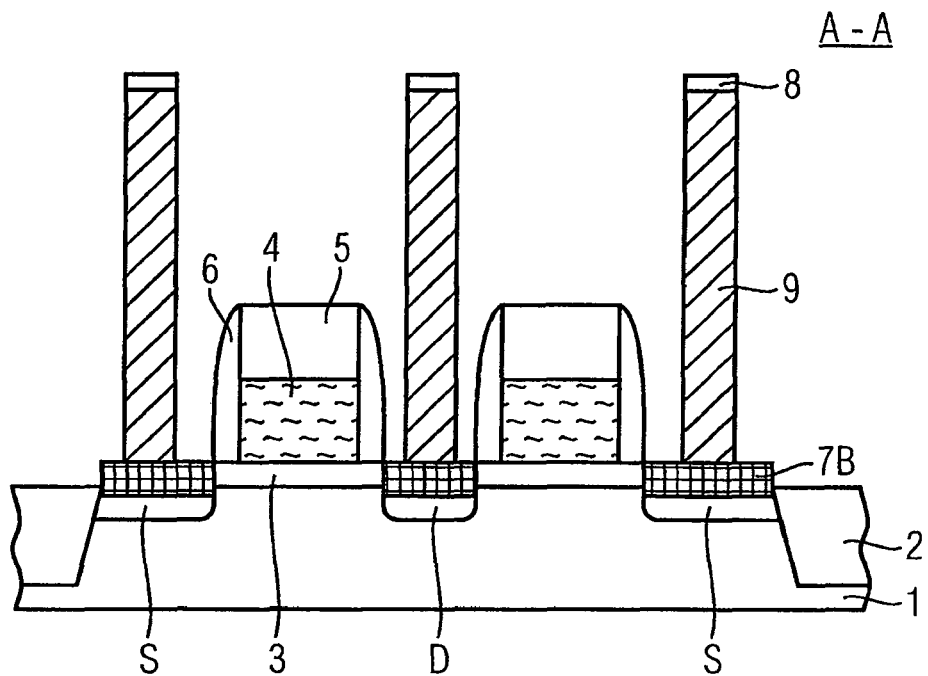
Figure 5B:
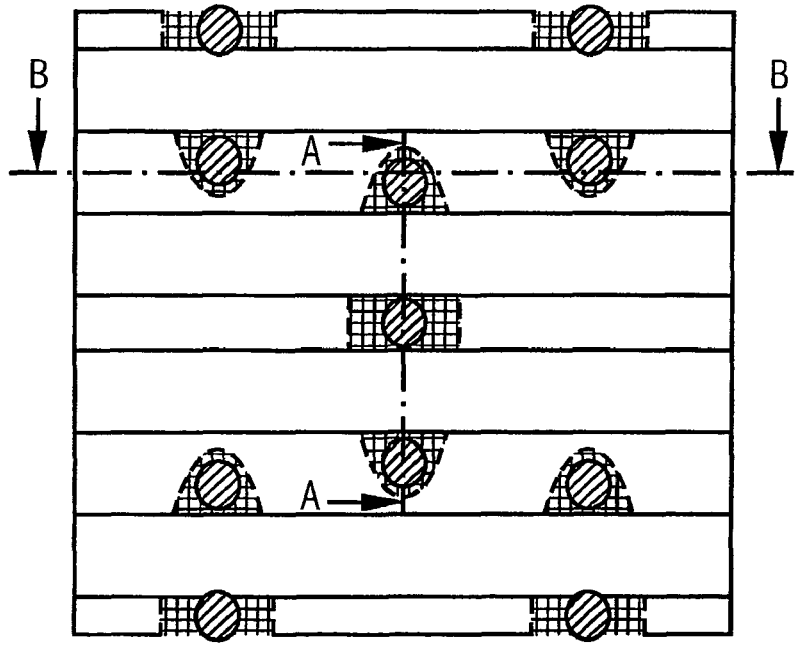
Figure 5C:
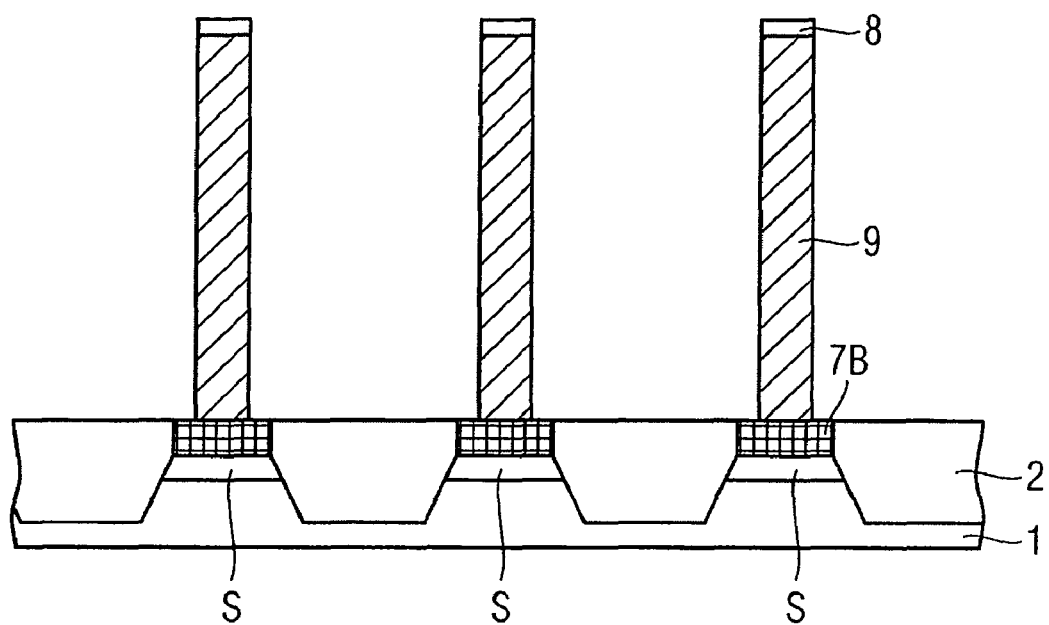

In accordance with FIGS. 5A to 5C, the vertical interconnect structures are now produced at the surface of the contact regions or of the metal-semiconductor compounds 7B formed at the source and drain regions S and D. In order to avoid processing of edge regions, the latter or a corresponding periphery may once again be covered e.g. by means of a resist.

A respective catalyst is now formed selectively at the uncovered contact regions or at the surface of the metal-semiconductor compounds 7B, e.g. an electroless deposition method being carried out. By way of example, Ti, Pd, Pt, Au, Cu, Co, Cr, Hf, Ir, Mn, Mo, Ni, Rh, Ta, W, or Zr is deposited by means of an electroless deposition method only at the surfaces of the silicided source and drain regions S and D.

If a resist was used for masking in edge regions or at other locations of the semiconductor substrate 1, it can now be stripped or removed. Furthermore, the catalyst 8 may subsequently be coagulated for the purpose of further decreasing a cross-sectional area of the vertical interconnect structure to be formed. To put it more precisely, at a temperature of e.g. 200-500 degrees Celsius the catalyst is liquefied in such a way that catalyst droplets form at the surface of the metal-semiconductor compound 7B, which have a smaller area than the surface areas of said metal-semiconductor compounds 7B. A subsequent step there involves the formation of a free-standing electrically conductive nanoelement or a free-standing electrically conductive nanostructure 9 between the catalyst 8 and the contact region or silicided source and drain region S and D.

Hereinafter the nanoelements or nanostructures 9 formed are, in particular, nanowires, nanotubes or nanofibers, which are acquiring increasing importance in semiconductor technology. The literature reference Lieber, C. M. et al.: "Nanowire Superlattices", Nano Letters, Volume 2, No. 2, February 2002, discloses for example the production of such nanowires with modulated structures. Furthermore, the literature reference Cui, Y. et al.: "High Performance Silicon Nanowire Field Effect Transistors", Nano Letters, Volume 3, No. 2, 2003, pages 149-152, describes the use of silicon nanowires and carbon nanotubes in the production of field effect transistors. Furthermore, the literature reference Cui, Y., et al.: "Diameter-controlled synthesis of single-crystal silicon nanowires", Applied Physics Letters, Volume 78, No. 15, 9 Apr. 2001, pages 2214 to 2216, describes the use of silicon nanowires and the production thereof. Finally, the literature reference Merkulov, V., et al.: "Effects of spatial separation on the growth of vertically aligned carbon nanofibers produced by plasma-enhanced chemical vapor deposition", Applied Physics Letters, Volume 80, No. 3, 21 Jan. 2002, pages 476-478, discloses the production of vertical carbon nanofibers using an Ni catalyst.

Using one of the methods described above, the free-standing electrically conductive nanoelements or nanostructures 9 illustrated in FIGS. 5A to 5C are now formed in such a way that their height projects significantly above the height of the word line stacks with their hard mask layer 5 and the spacers 6. The free-standing electrically conductive nanoelements 9 are thus formed in a self-aligning manner and without the use of an additional lithography between the catalysts 8 and the contact regions or the source and drain regions S and D.

Optionally, said free-standing electrically conductive nanoelements 9, if semiconductor nanoelements and in particular silicon nanoelements are involved, may subsequently be silicided, whereby an electrical conductivity is significantly increased and the electrical properties of the vertical interconnect structure are thus greatly improved. To put it more precisely, it is possible, once again using a blocking mask in the periphery or at parts of the semiconductor substrate which have to be protected, to apply e.g. a Co/TiN layer stack by sputtering, in which case, as in the case of the metal-semiconductor compound 7B, a first CoSi heat treatment is subsequently carried out, the remaining Co and TiN layers are subsequently subjected to wet etching or removed, and a second CoSi annealing is finally carried out. Preferably, the entire free-standing nanoelement 9 is completely silicided in this case. It goes without saying that other metals, such as Ni for example, are also possible for siliciding, a nickel silicide being formed for the silicon nanoelement 9.

In the—not illustrated—edge regions or connection regions for the word line stacks, corresponding word line contact regions are, of course, firstly covered in order to reliably prevent an undesirable formation of nanoelements. Said word line stacks are usually contact-connected in a conventional manner by means of photolithographic patterning processes, corresponding contact holes being etched free and electrically conductive filling material subsequently being introduced.

Figure 6:
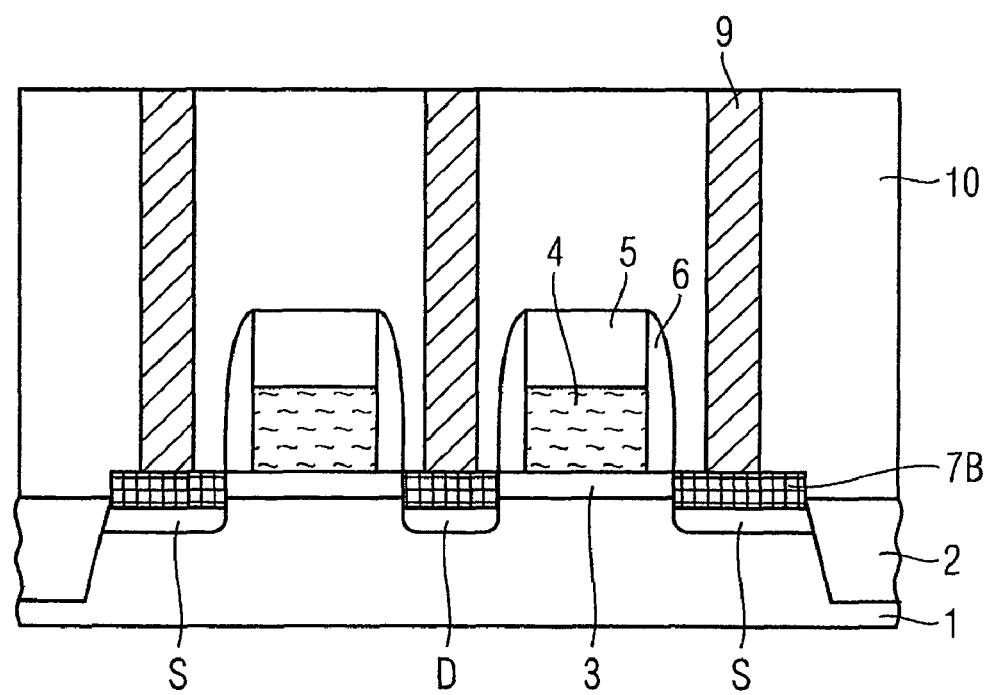

In accordance with FIG. 6, the free-standing nanoelements 9 are now completely embedded in a dielectric layer 10, preferably a whole-area deposition of $SiO_2$ being carried out with subsequent planarization by means of a CMP method which is stopped at the surface or upon reaching the topmost regions of the nanoelements 9. In this way, the free-standing nanoelements 9 can be mechanically stabilized and insulated from one another with a high-quality dielectric material, whereby the electrical and mechanical properties of a semiconductor component are improved. On account of the CMP planarization method used, the catalysts 8, which are no longer required, are simultaneously removed automatically and cost-effectively.

A CVD method (Chemical Vapor Deposition) is preferably used for depositing the dielectric layer 10, in which case the material may have TEOS, in particular.

Figure 7:
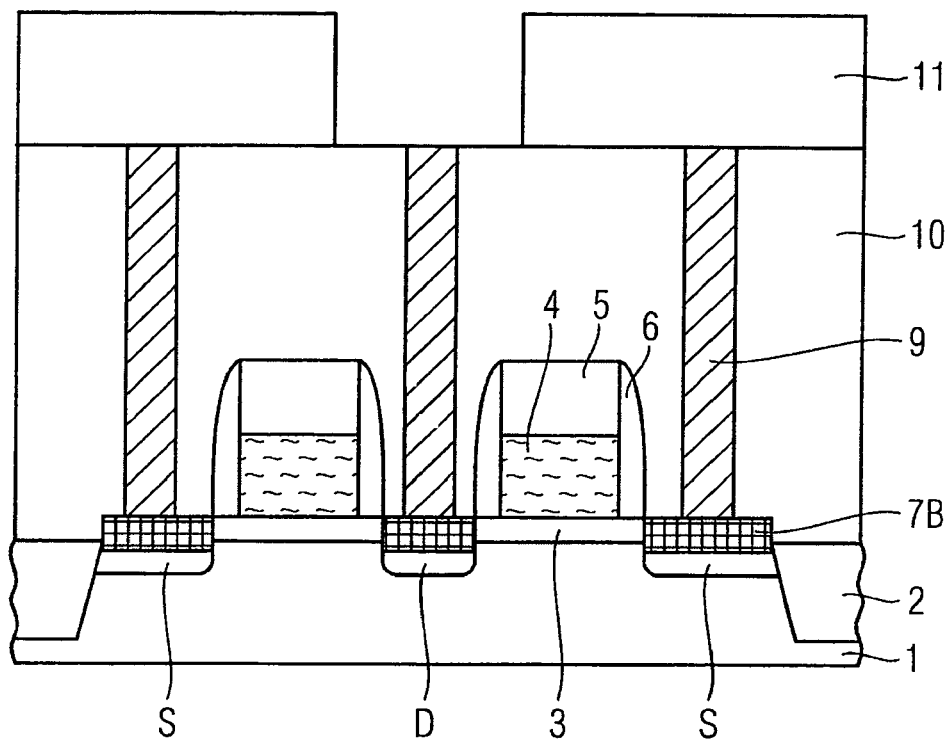
Figure 8A:
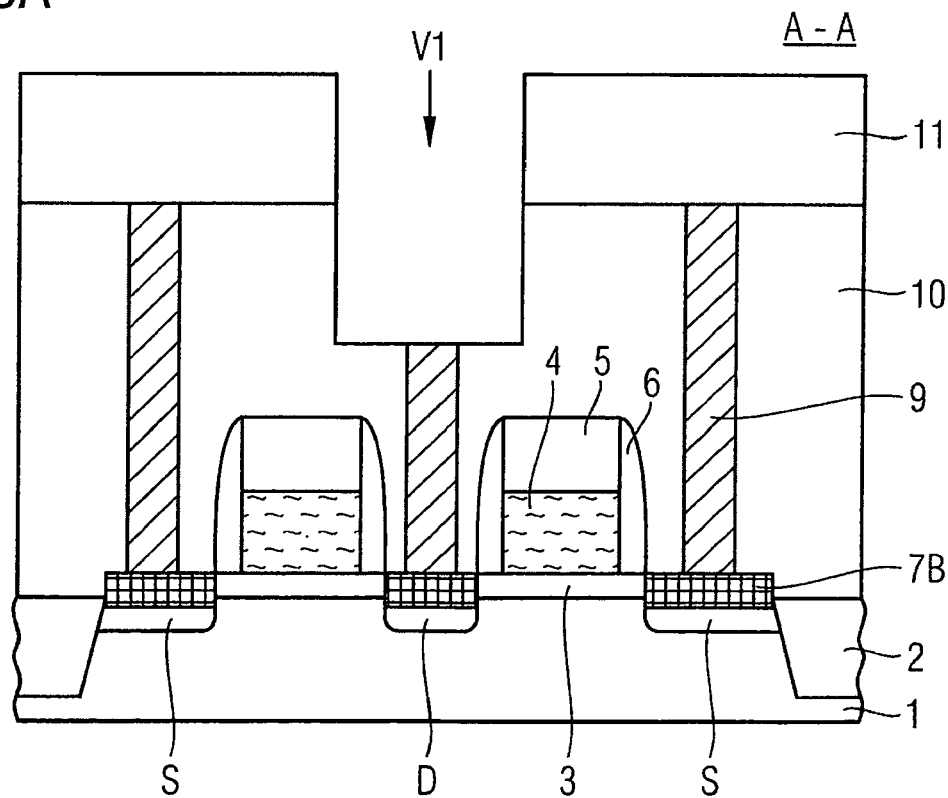
Figure 8B:
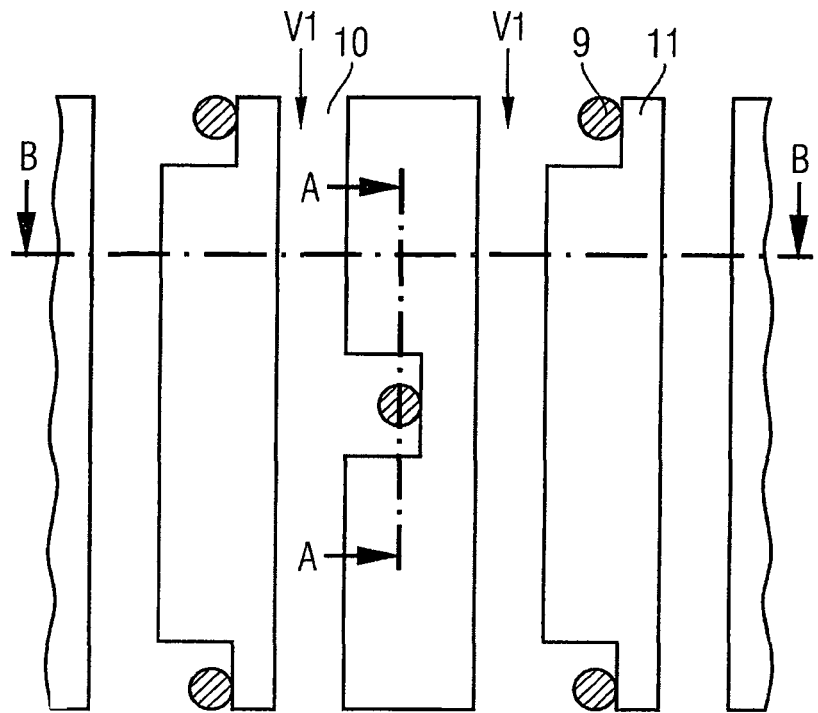
Figure 8C:
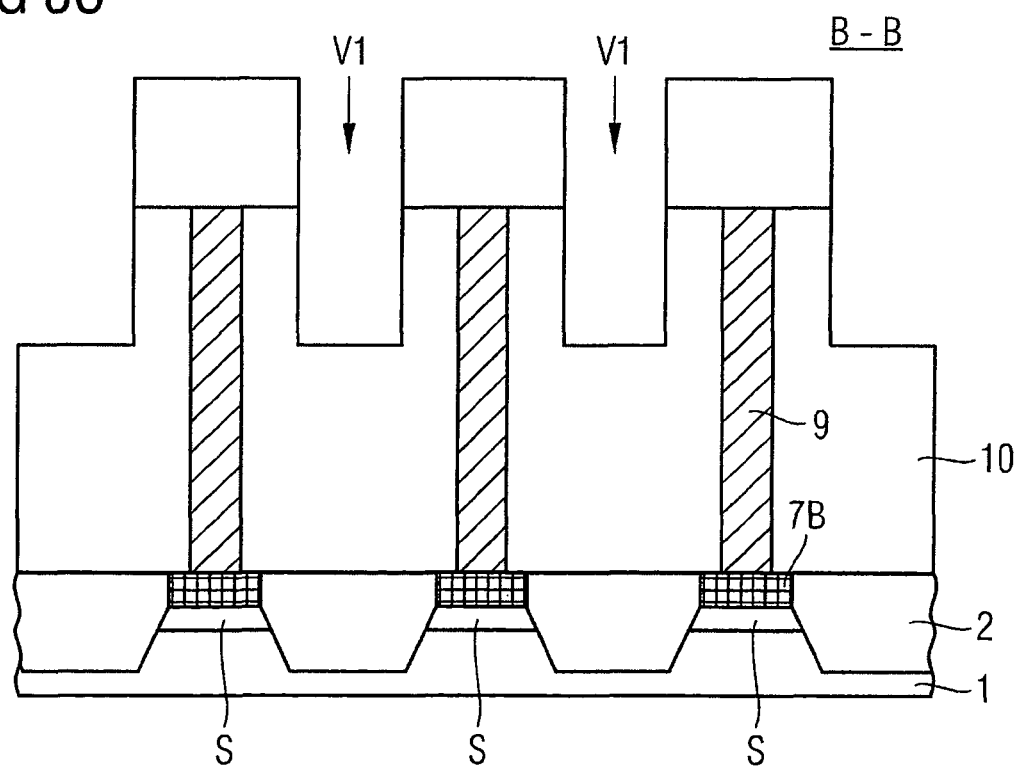

In accordance with FIG. 7, a further resist layer 11 is applied and patterned photolithographically at the planarized surface of the dielectric layer 10 or of the nanoelements 9. In order to form a bit line, in this case a first depression V1 is etched in the dielectric layer 10 in the region of the common nanoelement 9 formed above the common drain region D, the nanoelement or the nanostructure 9 also being removed at the same time. FIG. 8B illustrates a corresponding plan view, FIG. 8C in turn illustrating a sectional view in accordance with the section B-B.

Figure 9A:
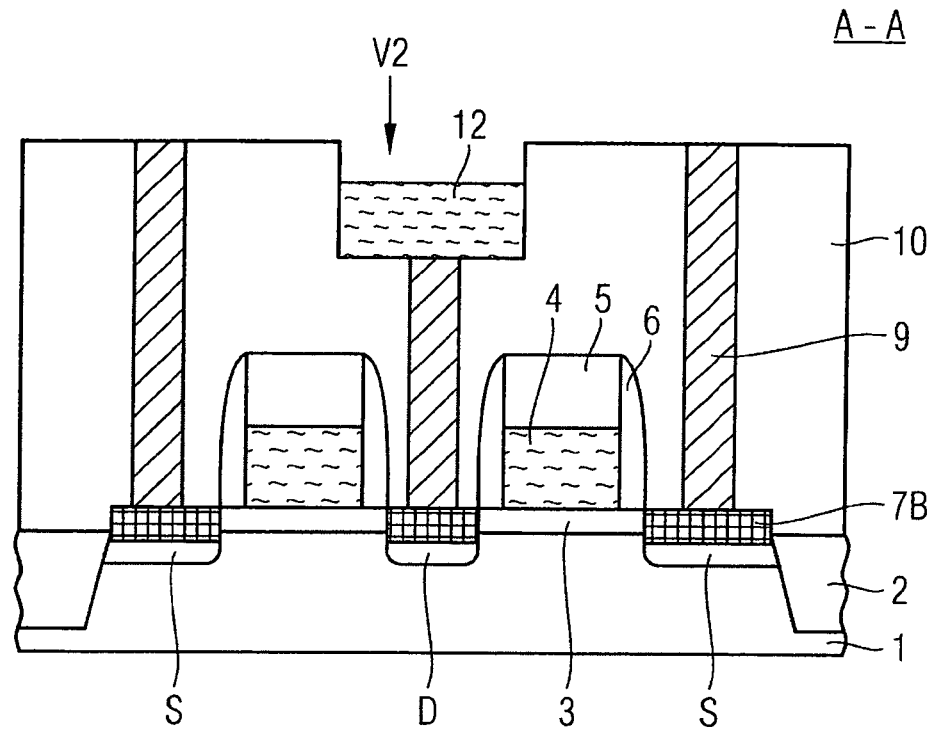
Figure 9B:
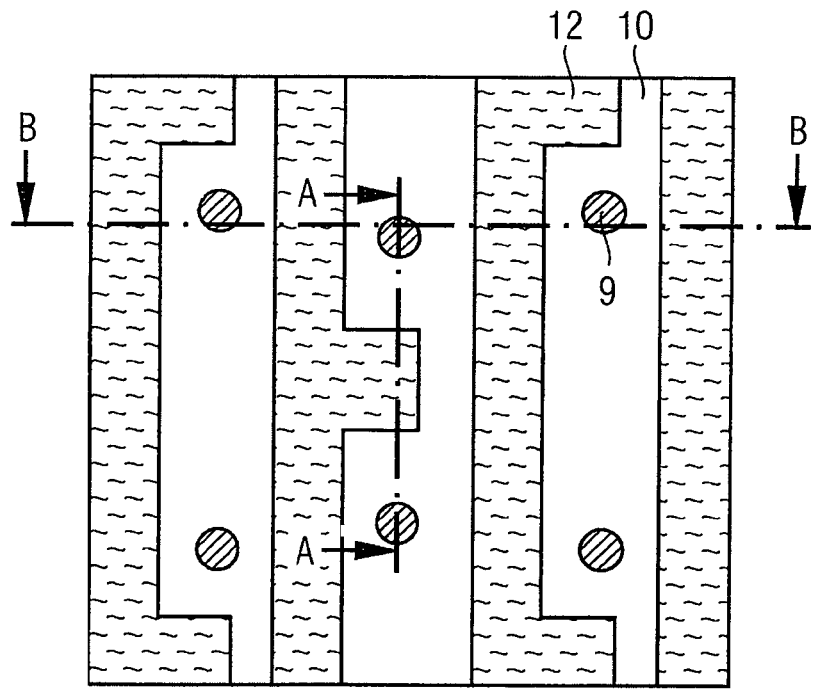
Figure 9C:
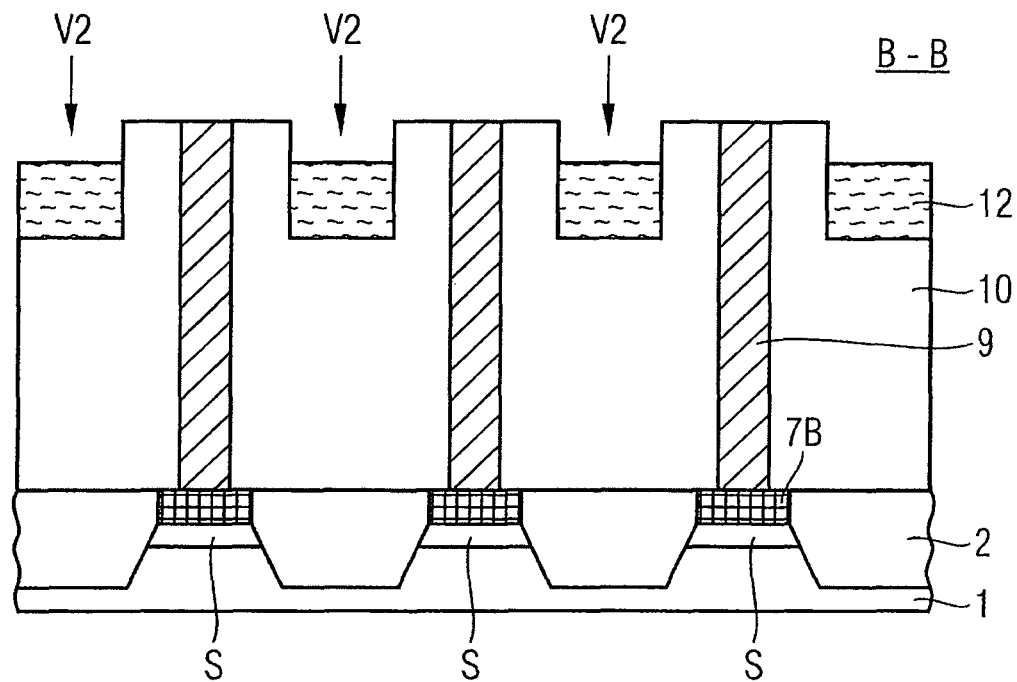

After this formation of the first depression V1 or the etching of the dielectric layer 10 and the upper region of the nanoelement 9 for the common drain region D, in accordance with FIGS. 9A to 9C the resist is subsequently removed and the first depression V1 is filled with a bit line layer 12 and the bit line layer 12 is subsequently etched back again in order to form a second depression V2. Doped polycrystalline semiconductor material, and in particular polysilicon, is preferably used as material for the bit line or the bit line layer 12. In principle, however, it is also possible to use metallic materials, and in particular tungsten, as the bit line layer 12.

Figure 10:
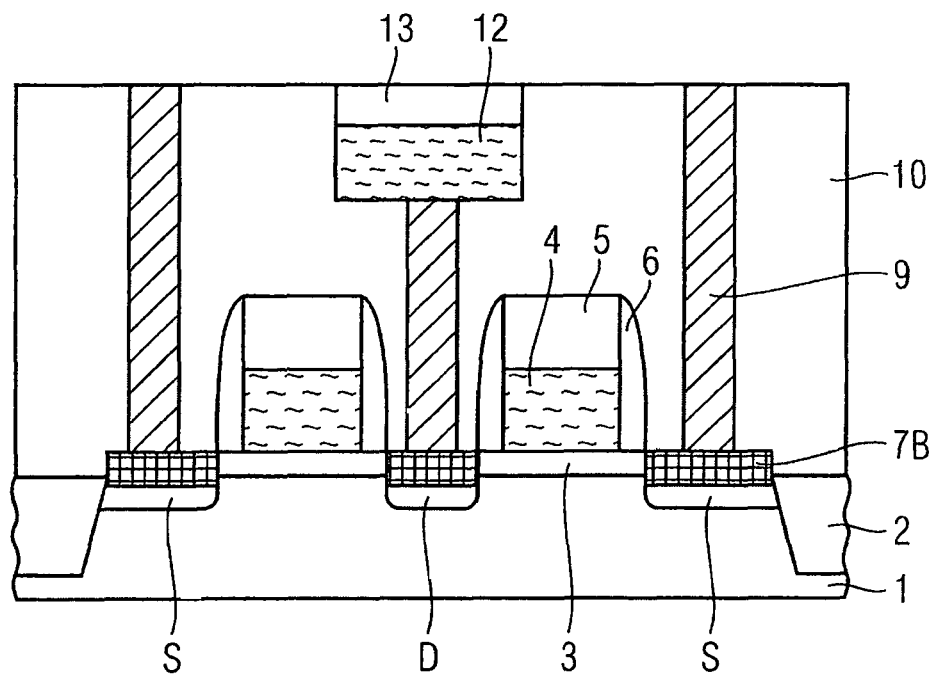

Afterward, in accordance with FIG. 10, the second depression V2 is completely filled with a dielectric filling material 13, thus resulting in a bit line layer 12 or bit line which is completely embedded in the dielectric layer 10 and is connected to the common drain region D via a common nanoelement 9. Preferably, as the dielectric filling material 13, $SiO_2$ is once again deposited over the whole area by means of a CVD method and a renewed planarization method is carried out, the upper regions of the further nanoelements 9 serving as stop layers.

Figure 11:
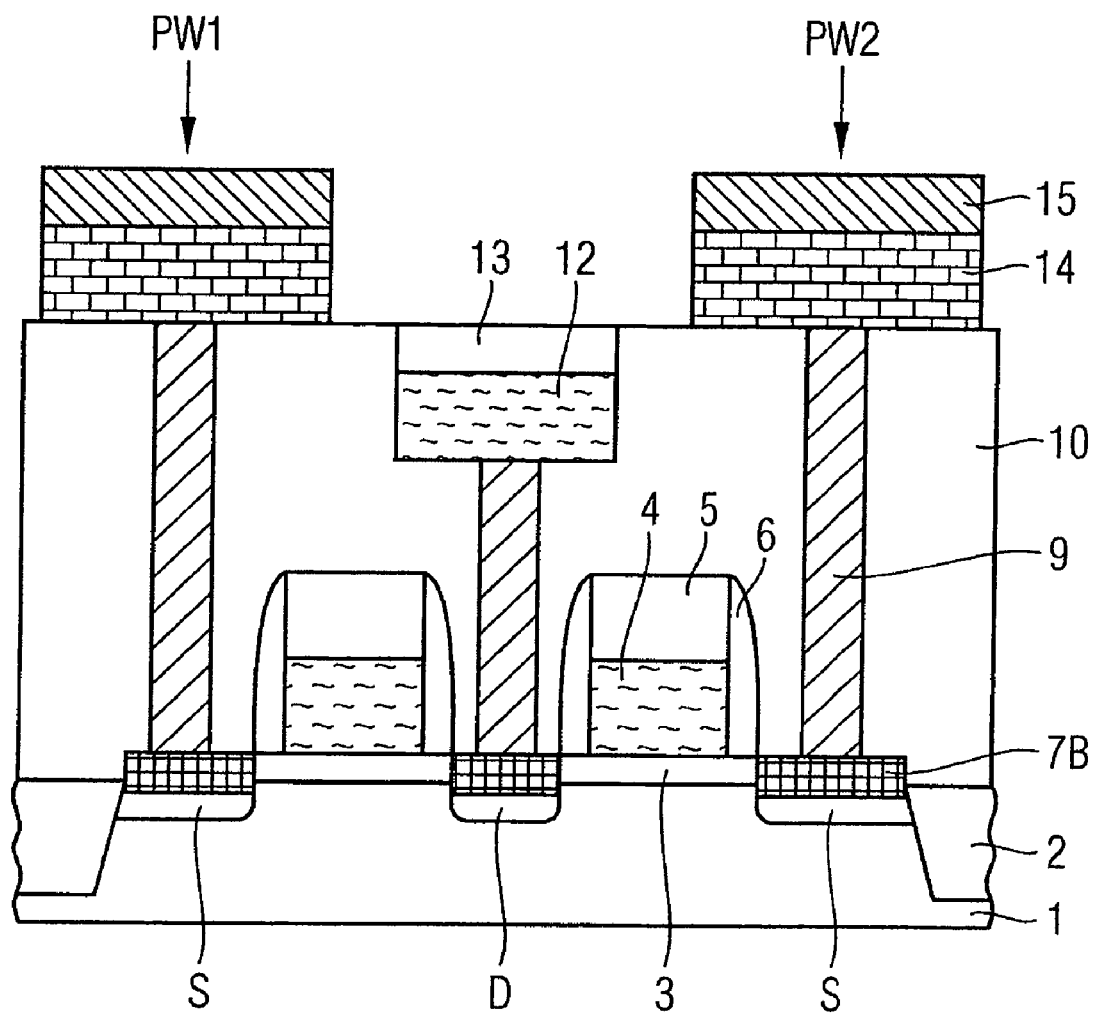

In accordance with FIG. 11, the memory elements are now formed at the planarized surface of the dielectric layer or of the uncovered nanoelements 9, so-called phase change memory elements PW1 and PW2 being formed in accordance with the first exemplary embodiment.

Such phase change memory elements use materials which, with regard to their electrical properties, are capable of changing over reversibly from one phase to another phase. By way of example, such materials change between a phase ordered in amorphous fashion and a phase ordered in crystalline or polycrystalline fashion. In particular a resistance or a conductance of such a material differs greatly in these two difference phase states.

Therefore, phase change memory elements usually use such phase change materials, which for example constitute alloys of elements in group VI of the periodic table and are referred to as so-called chalcogenides or chalcogenide materials. Accordingly, such phase change materials are understood hereinafter to be materials which can be changed over between two different phase states having different electrical properties (resistances).

Currently the most widespread chalcogenides or phase change materials comprise an alloy of Ge, Sb and Te (GST, $Ge_xSb_yTe_z$). $Ge_2Sb_2Te_5$ is already used in a large number of phase change memory elements and is furthermore known as a material for rewritable optical storage media (e.g. CDs, DVDs, etc.).

The changes in the resistance of phase change materials are utilized in order, for example, to create nonvolatile memory devices (NVM, Non Volatile Memory) and to store information. Accordingly, such materials have a higher resistance in the amorphous phase than in the crystalline or polycrystalline phase. Accordingly, a phase change material may be used as a programmable resistor, the resistance magnitude of which can be reversibly altered depending on its phase state.

An overview of such phase change materials is disclosed for example in the literature reference S. Hatkins et al.: "Overview of phase-change chalcogenide non-volatile memory technology", MRS Bulletin/November 2004, pages 829-832.

A change in the phase in such materials may be caused by a local increase in a temperature. Both phase states are usually stable below 150 degrees Celsius. Above 300 degrees Celsius, rapid crystal nucleation takes place, resulting in a change in the phase state to a crystalline or polycrystalline state, provided that such a temperature is present for a sufficient length of time. To return the phase state to the amorphous state, the temperature is increased to above the melting point of 600 degrees Celsius, followed by very rapid cooling. Both critical temperatures, i.e. both for the crystallization and for the melting, can be generated using an electric current which flows through an electrically conductive connection electrode with a predetermined resistance and is in contact with or in the vicinity of the phase change material. The heating is in this case carried out by so-called Joule heating.

In accordance with FIG. 11, such a phase change material 14 is now deposited over the whole area at the planarized surface or the nanoelements 9, a PVD or CVD method preferably being carried out. Afterward, a phase change electrode layer 15 is once again preferably deposited over the whole area at the surface of the phase change material layer 14, TiN being deposited, for example. Finally, this layer stack is patterned using conventional photolithographic methods, whereby the phase change memory elements PW1 and PW2 illustrated in FIG. 11 can be realized at the surface regions of the nanoelements.

Whereas the very high programming currents required, which are necessary for the change in the phase state, constitute a significant disadvantage in conventional phase change memory elements, for the first time and without additional costs it is possible, on account of the nanoelements 9 used, to realize very small contact areas to the phase change memory element, which enable the current path to be spatially delimited to a great extent and thus enable the phase change memory elements PW1 and PW2 to be programmed even with very small programming currents. This results in a nonvolatile memory device with an extremely high integration density which can be produced extremely cost-effectively and can be operated with very low programming currents.

Further resistively switchable memory elements may also be used besides the phase change memory element described above. They include MRAM memory elements (Magnetic RAM), for example, in which a magnetic layer can be programmed for storing items of information and be read. Furthermore, CBRAM memory elements (Conductive Bridging RAM) are known, for example, in which a conductivity can be set in a solid electrolyte or chalcogenide by producing conductive microbridges. The literature reference G. Müller et al.: "Status and Outlook of Emerging Nonvolatile Memory Technologies", IEEE 2004, describes corresponding memory elements.

Figure 12A:
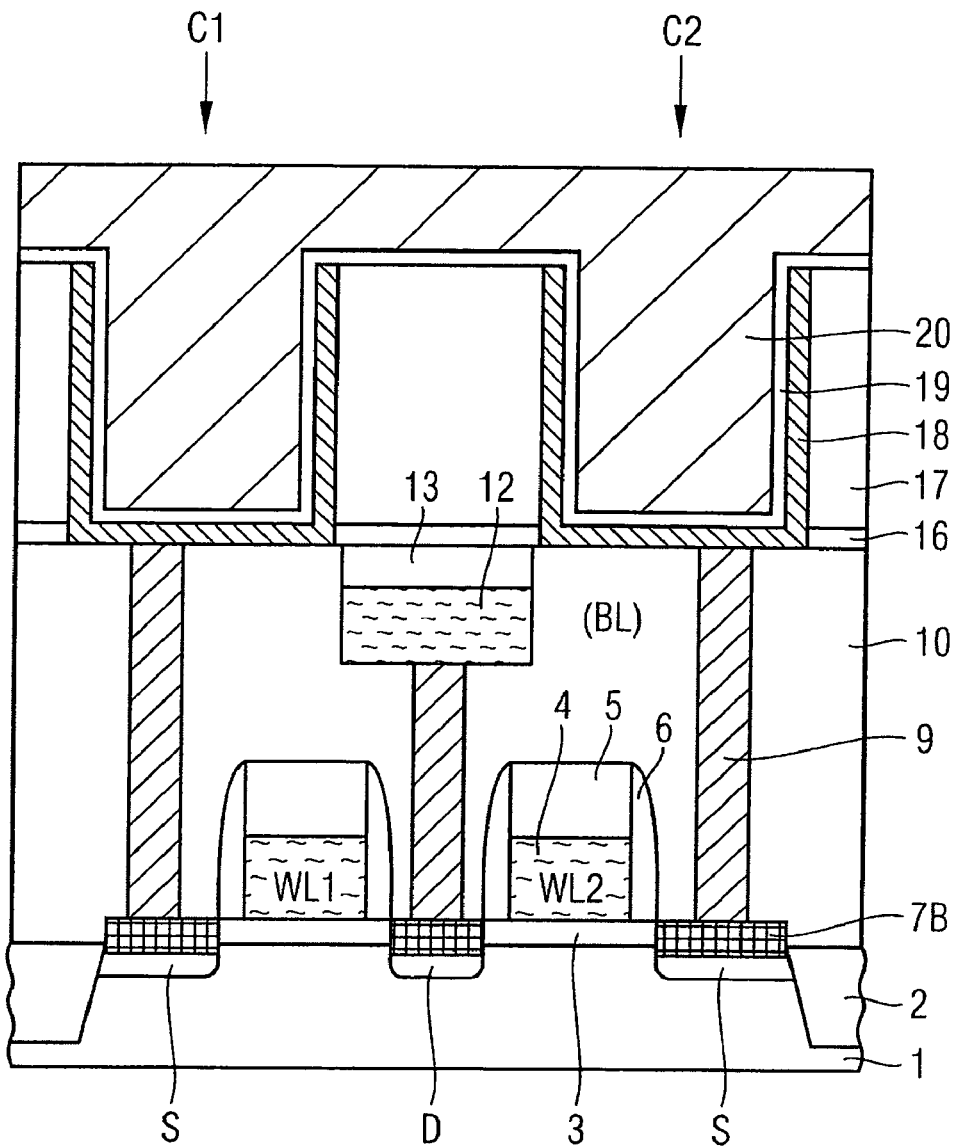
FIGS. 12A and 12B show a simplified sectional view and also an associated equivalent circuit diagram of a memory device in accordance with a second exemplary embodiment.
Figure 12B:
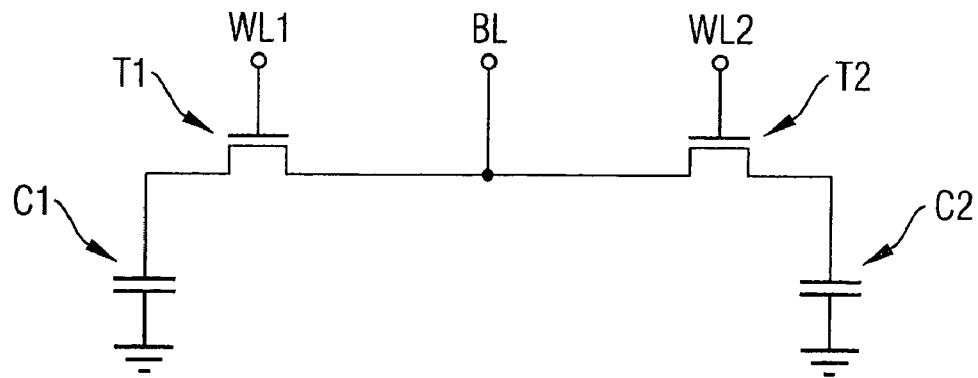

FIGS. 12A and 12B show a simplified sectional view of a memory device in accordance with a second exemplary embodiment, stacked capacitors C1 and C2 being used as volatile memory elements instead of the phase change memory elements. In this case, identical reference symbols designate layers and elements identical or corresponding to those in FIGS. 1 to 11, for which reason a repeated description is dispensed with below.

In accordance with the equivalent circuit diagram according to FIG. 12B, the memory device according to the invention thus has two selection transistors T1 and T2, which are respectively connected to a word line WL1 and WL2 and the common drain of which is connected to a common bit line BL. As memory elements, the capacitors C1 and C2 are connected to the respective source regions of the selection transistors T1 and T2, which preferably comprise field effect transistors.

The same method steps as illustrated in FIGS. 1 to 10 are once again carried out in accordance with the second exemplary embodiment, for which reason the detailed description of said method steps is dispensed with below. According to a method step as is illustrated in FIG. 10, in accordance with the second exemplary embodiment firstly an etching stop layer 16 is formed over the whole area, a thin SiN etching stop layer being deposited by means of a CVD method, by way of example. A further dielectric layer 17 is subsequently formed at the surface of said etching stop layer 16, an SiO$_2$ layer preferably again being deposited by means of a CVD method.

Using a resist (not illustrated), a trench or depressions is or are subsequently formed into said further dielectric layer 17 as far as the surface of the dielectric layer 10 at least in the region of the further nanoelements 9 for the source regions S, the further nanoelements 9 being uncovered at their upper surface.

A first capacitor electrode layer 18 is subsequently formed at least at the bottom of the trench surface or the depressions, preferably a polycrystalline semiconductor layer and in particular doped polysilicon being deposited by means of a CVD or ALD (Atomic Layer Deposition) method and being patterned by means of a CMP method. As an alternative, a metal layer such as e.g. TiN may also be used as the first electrode. A capacitor dielectric layer 19 is subsequently formed at least at the surface of the first capacitor electrode layer 18, a so-called high-k dielectric (e.g. Al$_2$O$_3$) preferably being deposited over the whole area by means of ALD methods. Finally, a second capacitor electrode layer 20 or the capacitor counterelectrode is deposited over the whole area, a TiN layer preferably being deposited by means of a CVD or ALD method.

The memory device in accordance with a second exemplary embodiment as illustrated in FIG. 12A is obtained in this way, which once again has a high integration density and can be produced in a particularly cost-effective manner. The significant cost advantages arise in particular on account of the vertical interconnect structures which are grown in a self-aligning manner at the surface of the source and drain regions S and D.

Furthermore, it is also possible to use capacitors as nonvolatile memory elements, the capacitor dielectric comprising e.g. a ferroelectric material, e.g. PZT (lead zirconium titanate). Memory elements of this type are usually referred to as FeRAM memory elements (ferroelectric RAM). The literature reference G. Müller et al.: "Status and Outlook of Emerging Nonvolatile Memory Technologies", IEEE 2004, describes corresponding memory elements.

FIGS. 13A to 16B show further sectional views and also plan views for illustrating essential method steps in the production of a memory device in accordance with a third exemplary embodiment, identical reference symbols designating elements identical or corresponding to those in FIGS. 1 to 12, for which reason a repeated description is dispensed with below.

Figure 13A:
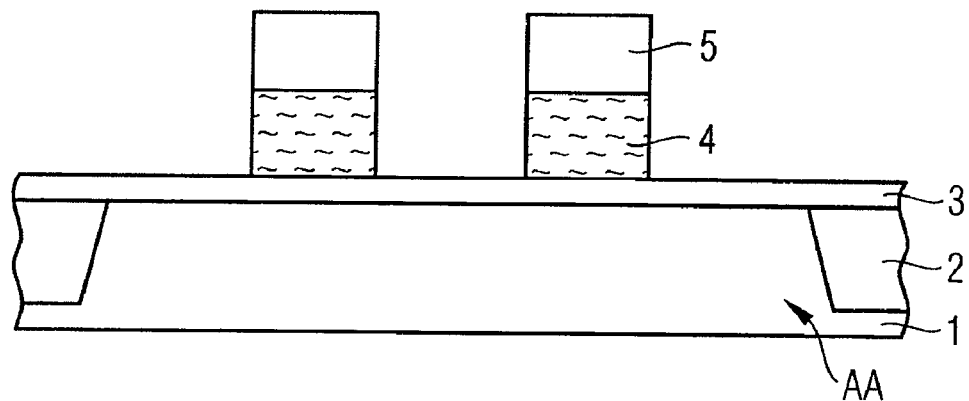
FIGS. 13A to 16B show simplified sectional views and also plan views for illustrating essential method steps in the production of a memory device in accordance with a third exemplary embodiment.
Figure 13B:
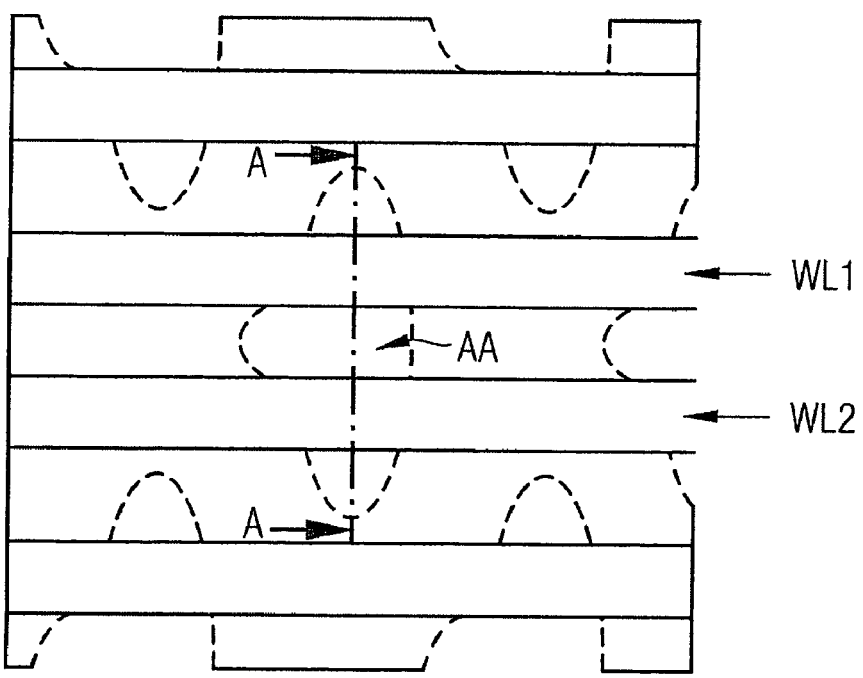

In accordance with FIGS. 13A and 13B, firstly insular active regions AA are once again formed at the surface of the carrier substrate 1 by means of an STI method and strip-type word line stacks or word lines WL1 and WL2 are arranged there above. In contrast to the first and second exemplary embodiments, however, the active region AA has a laterally protruding projection in its central region, in which a common drain region D will be formed later, said projection being provided for direct contact-connection of the common drain region D by a bit line layer that is to be formed later.

Figure 14:
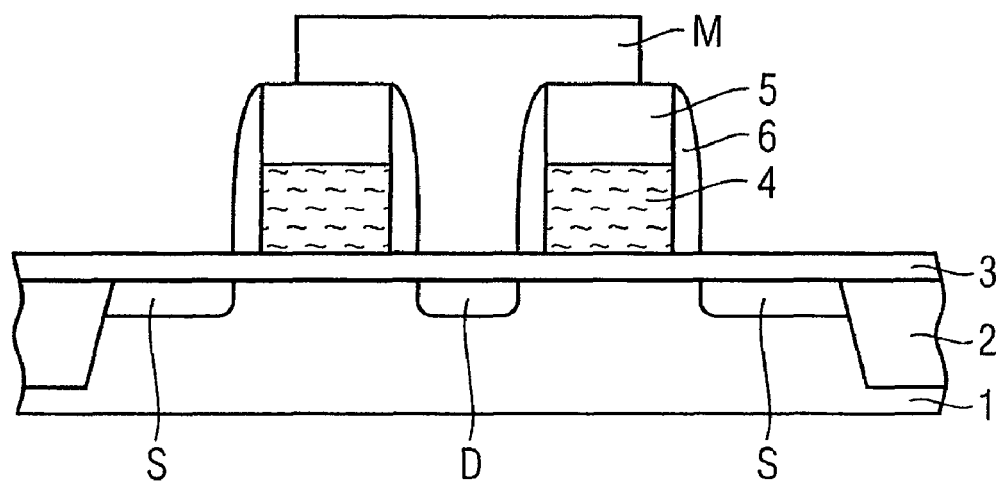

In accordance with FIG. 14, in this case, after forming the spacers 6 and carrying out the various implantations for forming the source and drain regions S and B, a drain mask M is preferably formed in strip-type fashion between the word line stacks WL1 and WL2 for the purpose of covering at least the common drain region D.

Preferably, a so-called SiLK is in this case deposited over the whole area and patterned in accordance with FIG. 14, reference being made in particular to the literature reference A. Birner et al.: "A fourth material: Thermally stable organic gap-fill spin-on-polymer enabling new integration concepts", IEDM Tech. Dig., December 2003, pages 665 to 668. This mask layer M, which is also used as a blocking mask for later siliciding, may likewise be formed in the edge regions or the periphery of a respective semiconductor circuit.

Figure 15:
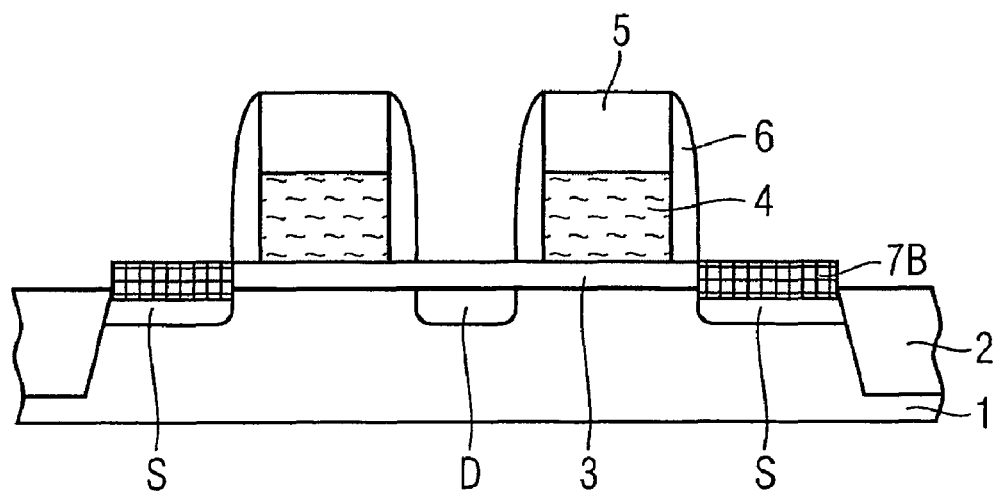

In accordance with FIG. 15, after the removal of the gate dielectric layer 3 at the uncovered surfaces of the carrier substrate 1 using, for example, dilute hydrofluoric acid (HF), a metal-semiconductor compound 7B is once again implemented at the uncovered contact regions or at the uncovered source regions S, in which case it is possible to form e.g. CoSi$_x$ as metal-semiconductor compound 7B. Reference is made here to the comparable process steps in accordance with the first and second exemplary embodiments.

Preferably, however, prior to the second CoSi annealing step, the SiLK mask is removed selectively with respect to the SiO$_2$ and Si$_3$N$_4$ and the second annealing step is then carried out. Afterward, the same steps as in FIGS. 5 and 6 are once again carried out, but after the planarization step as far as the upper surfaces of the nanoelements 9 in accordance with FIG. 6, now the dielectric layer 10 is etched back in order to uncover an upper region of the nanoelements 9 and a dielectric etching stop layer 21 is subsequently formed at the surface of the dielectric layer 10 and the uncovered regions of the nanoelements 9.

Preferably Si$_3$N$_4$ is once again deposited over the whole area as the dielectric etching stop layer 21. An auxiliary dielectric layer 22 is subsequently formed over the whole area at the surface of the etching stop layer 21, an SiO$_2$ deposition with subsequent planarization preferably being carried out.

In order to form the bit line, in the region of the common drain region D, a trench is subsequently formed in the dielectric layer 10, the etching stop layer 21 and the auxiliary dielectric layer 22 down to the drain region D and the trench is firstly completely filled with the bit line layer 12. Preferably polycrystalline semiconductor materials, and in particular doped polysilicon, are once again used as materials for the bit line layer 12. In principle, however, it is also possible to use metallic materials, and in particular tungsten.

The bit line layer 12 is once again etched back in its upper region in order to form a further depression and the further depression is finally filled completely with the dielectric filling material 13. In this case, materials comparable to those in the first or second exemplary embodiment are once again used and a whole-area deposition of SiO$_2$ with subsequent planarization is preferably carried out.

Finally, as in the first exemplary embodiment, phase change memory elements PW1 and PW2 may once again be formed at the locations of the uncovered nanoelements 9 or at the surface of the auxiliary dielectric layer 22, the memory device being completed in accordance with the third exemplary embodiment.

Figure 16A:
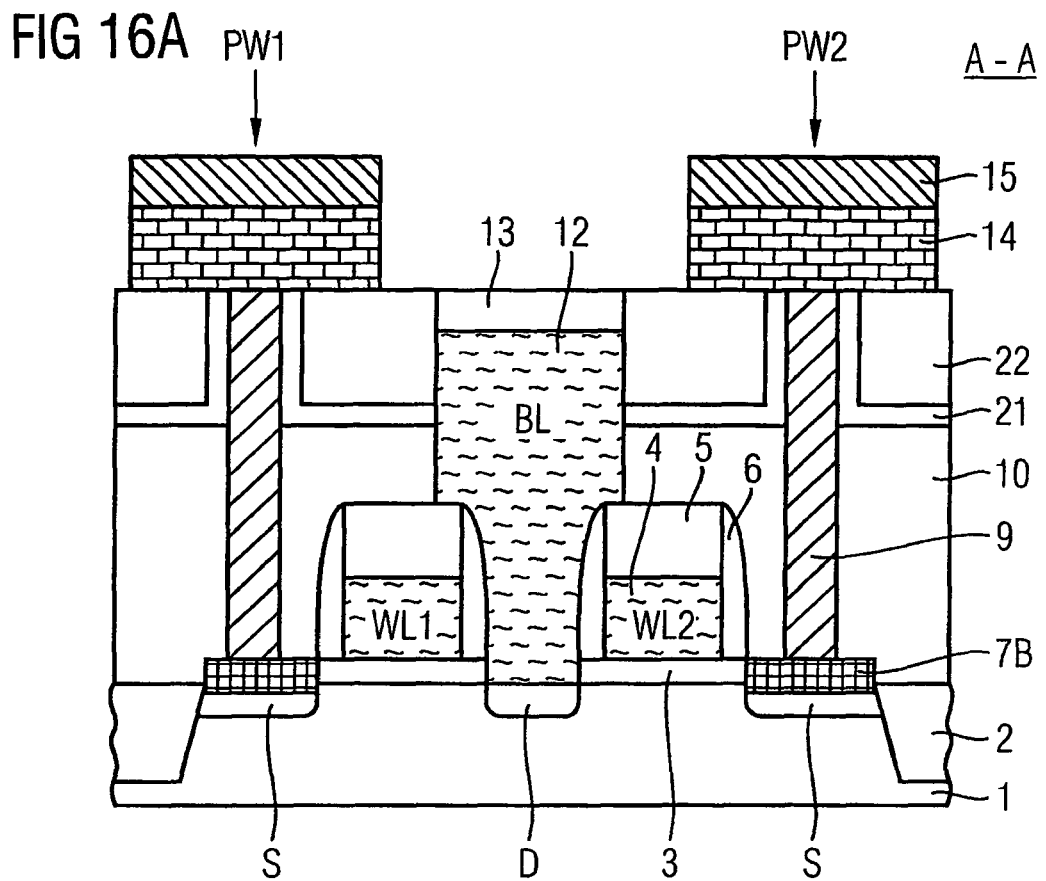

Once again, a memory device with a maximum integration density in which contact-connection is formed essentially in a self-aligning manner is obtained, in accordance with FIG. 16A.

Figure 16B:
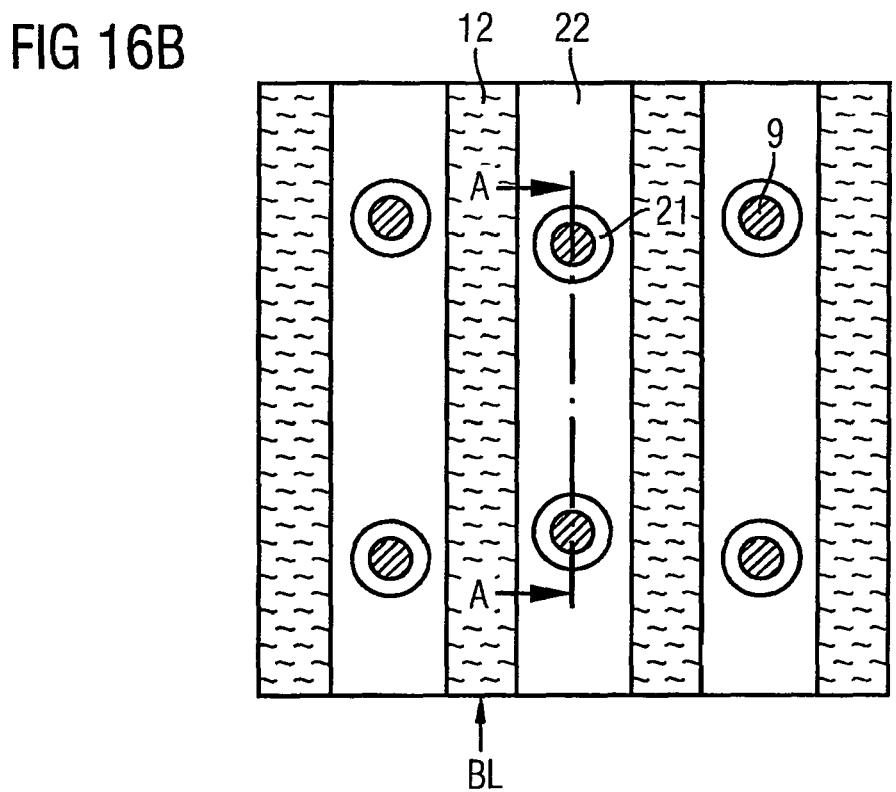

FIG. 16B shows a simplified plan view with a sectional illustration A-A of the sectional view illustrated in FIG. 16A in order to illustrate this third exemplary embodiment.

In accordance with this third exemplary embodiment, it is consequently possible to employ a so-called dual damascene bit line process, which enables the costs to be reduced further. It goes without saying that further additional hard masks can also be used in accordance with the third exemplary embodiment.

The present invention has been described on the basis of phase change memory elements and capacitors as memory elements. However, it is not restricted thereto and also encompasses alternative memory elements in the same way. Furthermore, the invention has been described on the basis of two one-transistor memory cells in which two selection transistors are formed in an active region. However, it is not restricted thereto and also encompasses other types of memory cells in the same way.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

We claim:

1. A method for producing a vertical interconnect structure comprising the steps of:
    forming a contact region on a surface of a carrier substrate;
    forming a gate dielectric directly on portions of the surface of the carrier substrate where the contact region is not present;
    forming a catalyst on the contact region by selective electroless deposition;
    forming a free-standing electrically conductive Si nanoelement between the catalyst and the contact region;
    fully siliciding said Si nanoelement;
    completely embedding the free-standing and fully silicided Si nanoelement in a dielectric layer, wherein the dielectric layer is not the gate dielectric; and
    removing of the catalyst by chemical mechanical polishing planarization of the dielectric layer.

2. The method as claimed in claim 1, wherein the contact region constitutes a doped semiconductor region.

3. The method as claimed in claim 2, wherein a metal-semiconductor compound is formed at the surface of the contact region.

4. The method as in claim 1, wherein the catalyst is coagulated in order to reduce the area of catalyst.

5. The method as claimed in claim 1, further comprising the step of forming free-standing nanowires, nanotubes or nanofibers when the free-standing electrically conductive nanoelement between the catalyst and the contact region is formed.

6. A method for producing a vertical interconnect structure comprising the steps of:
    forming a contact region on a surface a carrier substrate;
    forming a gate dielectric directly on portions of the surface of the carrier substrate where the contact region is not present;
    forming a catalyst on the contact region by selective electroless deposition;
    forming a free-standing electrically conductive Si nanoelement between the catalyst and the contact region;
    fully siliciding said Si nanoelement;
    completely embedding the free-standing and fully silicided Si nanoelement in a dielectric layer, wherein the dielectric layer is not the gate dielectric;
    removing of the catalyst by chemical mechanical polishing planarization of the dielectric layer; and
    forming and fully siliciding Si nanoelements when the free-standing electrically conductive nanoelement between the catalyst and the contact region is formed.

7. The method as claimed in claim 1, further comprising the steps of depositing $SiO_2$ as the dielectric layer and planarizing the $SiO_2$ as far as the nanoelement.

* * * * *